Dec. 9, 1958 WOO F. CHOW 2,863,995
SUPERREGENERATIVE DETECTOR CIRCUIT USING TRANSISTORS
Filed Jan. 31, 1955
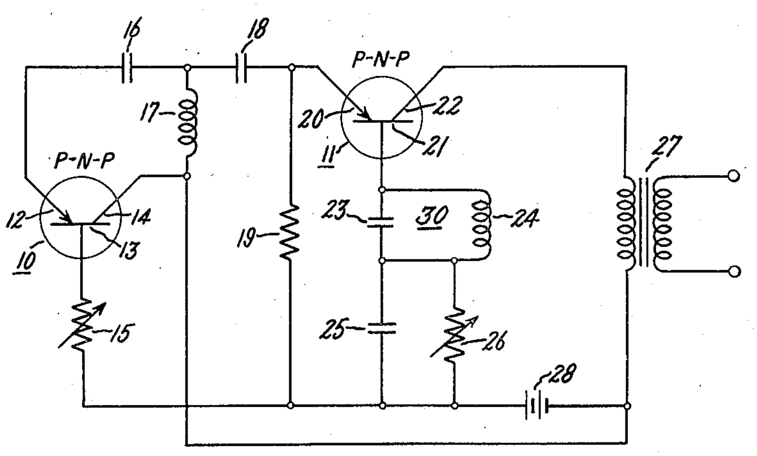
INVENTOR:
WOO F. CHOW,
BY George V. Eltgroth
HIS ATTORNEY.

United States Patent Office 2,863,995

Patented Dec. 9, 1958

2,863,995

SUPERREGENERATIVE DETECTOR CIRCUIT USING TRANSISTORS

Woo F. Chow, Syracuse, N. Y., assignor to General Electric Company, a corporation of New York Application January 31, 1955, Serial No. 484,941

1 Claim. (Cl. 250—20)

This invention relates to superregenerative detector circuits, and more particularly to circuits of this character using transistor devices.

In the copending application by W. F. Chow and J. J. Suran, now U. S. Patent 2,792,494, assigned to the same assignee as the present application, a superregenerative detector utilizing junction type transistors is shown and described.

It is an object of the present invention to provide a new and improved superregenerative detector using point contact transistors or transistors having a current amplification factor which is greater than unity. In using transistors of this type, advantage is taken of their ability to operate at higher frequencies than junction type transistors.

It is a further object of the present invention to provide a superregenerative detector which produces large radio frequency amplification for frequencies difficult to amplify using conventional means.

A still further object of the invention is to provide a simplified superregenerative detector which provides excellent amplification yet has small power requirements.

These and other advantages of this invention will be more clearly understood from the following description taken in connection with the accompanying drawing, and the new and novel features that are considered characteristic of this invention will be set forth with particularity in the appended claim.

In the drawing, the circuit shown is a diagrammatic illustration of the invention.

The principles of operation of a superregenerative receiver are well known. Basically, the disclosed superregenerative detector comprises a radio frequency oscillator and a quench frequency oscillator. The detector operates by passing the radio frequency oscillator into and out of a self-oscillatory condition. This operation is controlled by the quench frequency oscillator. If a resonant circuit is included in the radio frequency oscillator circuit, the oscillations will then depend on a desired signal frequency determined by the frequency of the resonant circuit, and the amplitude of oscillation will depend on the amplitude of the superimposed signal current.

In the drawing, the quench frequency oscillator portion of the superregenerative detector shown comprises a PNP point contact transistor 10 connected in circuit to function as a relaxation oscillator. The negative terminal of a source of potential 28 is connected to collector 14, and the positive terminal of potential source 28 is connected through a variable resistance 15 to the base electrode 13 of point contact transistor 10. The emitter 12 of transistor 10 is connected to capacitance 16 which is connected in series with inductance 17. Inductance 17 is connected to collector 14 of transistor 10. Condenser 16 charges through the back resistance of the PN junction formed by the emitter 12 and the base 13 of the point contact transistor 10. As the charge on capacitance 16 increases, the emitter electrode 12 of transistor 10 becomes biased forwardly. Capacitance 16 then discharges through the active transistor in the forward direction. The output so derived is developed across an inductance 17. Inductance 17 acts to shape the oscillation wave form to approximate that of a sine wave. Due to the inherent characteristic of a point contact transistor which exhibits a negative resistance characteristic for a limited range of D. C. operating points, all that is necessary to maintain oscillation is to select an operating point which will occur in the negative resistance region. Having selected such an operating point, the disclosed configuration will function as a relaxation oscillator. The frequency of oscillation of the disclosed circuit is determined primarily by the back diode resistance of PN junction 12—13 and the value of variable resistance 15.

The detector portion of the superregenerative detector shown in the drawing includes a PNP point contact transistor 11 connected in circuit to function as a radio frequency oscillator. Resonant circuit 30, comprising capacitance 23 and inductance 24, determines the frequency at which transistor 11 oscillates. Resonant circuit 30 is connected to the base 21 of transistor 11 and through a variable resistance 26 to the positive terminal of source of potential 28. Variable resistance 26 is a self-bias resistance, and the D. C. voltage drop across it supplies emitter bias voltage to the emitter 20 of transistor 11. A capacitance 25 is also connected to resonant circuit 30 in shunt with resistance 26 to bypass radio frequency signals. The emitter 20 of point contact transistor 11 is connected through resistance 19 to the positive terminal of source of potential 28. Resistances 19 and 26 determine the bias on emitter 20 of transistor 11, and therefore determine the mode of operation of the detector. Collector 22 of point contact transistor 11 is connected to the output transformer 27. Like point contact transistor 10 in the network associated therewith, point contact transistor 11 exhibits a negative resistance characteristic in the illustrated network for a limited range of D. C. operating points. With a given negative resistance, it is relatively simple to construct an oscillator by associating a tuned circuit with the negative resistance in the base lead. All that is necessary to maintain oscillation is to select an operating point which occurs in the negative resistance region. The tuned circuit should be designed so that it will not provide a D. C. path that would change the D. C. operating point of the transistor.

In operation, point contact transistor 11 is biased so that it will not break into self-oscillation. The output of the quench frequency oscillator which is developed across inductance 17 is applied by coupling capacitor 18 to the emitter 20 of point contact transistor 11. When the quench signal voltage applied in this manner swings positive, the emitter 20 of point contact transistor 11 is biased such that the transistor 11 becomes active, which allows an oscillation to start building up. This oscillation continues to build up until the quench signal swings negative which biases point contact transistor 11 to cutoff. If radio frequency signals are applied to resonant circuit 30, the circuit oscillates with an amplitude related to the applied radio frequency energy. Radio frequency signals may be applied to resonant circuit 30 by utilizing inductance 24 as an inductive pickup coil, or by applying signals from an external source of the resonant circuit 30 by inductive coupling. The application of radio frequency signal current increases the emitter current of transistor 11 which likewise increases the collector current. Therefore, the amplitude of oscillation depends on the envelope of the radio frequency signal which is sampled by the quench frequency oscillator. Consequently, a variation in signal current appears as a variation in collector current which thus provides an output which corresponds to that of the applied signal. Output transformer 27 is connected to the collector 22 of transistor 11 in order to obtain the audio output. This output may be applied through an audio amplifier to a loudspeaker (not shown) to complete the receiver. The output of collector 22 may also be utilized by replacing transformer 27 with a set of headphones (not shown), in which case, the disclosed circuit would comprise a complete receiver.

It should be noted that the described circuit will oscillate in the absence of a desired signal frequency due to the inherent thermal agitation noise signals which are characteristic in the described circuit. However, if the signal currents are greater than the agitation noise currents, then the oscillations build up corresponding to the amplitude of the superimposed signal currents rather than to the amplitude of the smaller noise signal currents.

For proper operation of the disclosed circuit, it is essential that the transistor 11 be cut off sufficiently long to insure that the amplitude of oscillation tapers off to a value less than that of the noise or signal currents. If not, the envelope of the oscillation will not duplicate that of the input signal frequency. Thus, a variation in signal input current will not appear as a variation of collector current, and the desired signal will not be detected. In this respect, variable resistance 26 is provided to vary the emitter bias of transistor 11, and thus controls the buildup and decay periods.

Experimental results show that a gain of about 40 db may be obtained using the described circuit with a D. C. supply of approximately 6 volts, 3.5 milliamperes. This example is merely illustrative of the application of the principles of the invention, and the parameter of supply voltage may be varied to fit a particular circuit design.

In the disclosed embodiment of this invention, two PNP point contact transistors are used in order to obtain the advantage of having a common source of potential. As will appear obvious to those skilled in the art, two NPN point contact transistors may be used in the same circuit, provided that the polarities of the potential source are reversed. As will also appear obvious, other transistors having current multiplication factors greater than unity may be utilized.

Since other modifications and changes to fit particular operating requirements and environments will be apparent to those skilled in the art, the invention is not considered limited to the examples chosen for purposes of disclosure, and is intended to cover all modifications which do not constitute departures from the true spirit and scope of this invention.

What I claim as new and desire to secure by Letters Patent of the United States is:

A super-regenerative detector circuit comprising a quench frequency oscillator, a detector, and a single D.-C. source having a first and a second source terminal, said quench frequency oscillator comprising a first transistor having a current amplification greater than unity and having a first base, a first collector, and a first emitter electrode, a capacitance and an inductance serially connected betwen said first emitter and said first collector electrodes, first resistance means connected from said first base to said first source terminal, means connecting said first collector to said second source terminal; said detector comprising a second transistor having a current amplification greater than unity and having a second base, a second collector, and a second emitter electrode, second resistance means connected from said second emitter to said first source terminal, an output load impedance connected between said second collector and said second source terminal, means for providing a detected output signal coupled to said output load impedance, a tuned parallel resonant circuit, means connecting said tuned parallel resonant circuit between said second base and said first source terminal; means coupling the output of said quench frequency oscillator to said detector comprising a capacitance connected from a junction between said capacitance and said inductance to said second emitter.

References Cited in the file of this patent

UNITED STATES PATENTS

| | | |
|---|---|---|
| 2,076,168 | Turner | Apr. 6, 1937 |
| 2,679,594 | Fromm | May 25, 1954 |
| 2,692,337 | Hansen | Oct. 19, 1954 |
| 2,751,497 | Duncan | June 19, 1956 |

OTHER REFERENCES

Electrons at Work, article in August 1954 issue of Electronics, pages 220, 222 and 224.

50-MC Oscillator, article in September 1953 issue of Electronics, page 204.

Radio Electronics, July 1953, page 68.